United States Patent
Kim et al.

(10) Patent No.: US 11,953,023 B2
(45) Date of Patent: Apr. 9, 2024

(54) TWO-VANE PUMP AND DESIGN METHOD OF TWO-VANE PUMP FOR WASTEWATER USING MACHINE LEARNING

(71) Applicant: KOREA INSTITUTE OF INDUSTRIAL TECHNOLOGY, Cheonan-si (KR)

(72) Inventors: Jin Hyuk Kim, Incheon (KR); Sung Kim, Cheonan-si (KR); Sang Bum Ma, Incheon (KR)

(73) Assignee: Korea Institute of Industrial Technology, Cheonan-si (KR)

( * ) Notice: Subject to any disclaimer, the term of this patent is extended or adjusted under 35 U.S.C. 154(b) by 142 days.

(21) Appl. No.: 17/466,755

(22) Filed: Sep. 3, 2021

(65) Prior Publication Data
US 2022/0074427 A1 Mar. 10, 2022

(30) Foreign Application Priority Data
Sep. 4, 2020 (KR) .......................... 10-2020-0112912

(51) Int. Cl.
*G06F 30/27* (2020.01)
*F04D 1/06* (2006.01)
(Continued)

(52) U.S. Cl.
CPC ............. *F04D 29/445* (2013.01); *F04D 1/06* (2013.01); *F04D 7/04* (2013.01); *F04D 29/225* (2013.01);
(Continued)

(58) Field of Classification Search
CPC .................................. G06F 18/22; G06N 3/08
See application file for complete search history.

(56) References Cited

U.S. PATENT DOCUMENTS

2002/0136632 A1\* 9/2002 Kuykendal ........... F04D 29/669
415/119

FOREIGN PATENT DOCUMENTS

| CN | 111046504 A | \* | 4/2020 |
| KR | 10-1647394 B1 | | 8/2016 |
| KR | 101808077 B1 | | 1/2018 |

OTHER PUBLICATIONS

Kim et al. "Optimization of a Single-Channel Pump Impeller for Wastewater Treatment", IJFMS, 2016, pp. 370-381.\*
(Continued)

*Primary Examiner* — Li Wu Chang
(74) *Attorney, Agent, or Firm* — Rabin & Berdo, P.C.

(57) ABSTRACT

The present disclosure relates to a two-vane pump for wastewater and a design method of a two-vane pump for wastewater using machine learning, and more particularly, a design method of a two-vane pump using machine learning capable of having efficiency of a target head and performing optimal design for sizes of solids that can pass through and a two-vane pump for wastewater according to the machine learning. According to the present disclosure, there is provided a design method of two-vane pump for wastewater using machine learning, including: a) setting an objective function; b) setting design variables of the impeller and volute for deriving the set objective function and a range of each design variable; c) deriving a plurality of experimental points including values of the design variables within the range of the design variable; d) generating an input value by calculating the value of the objective function through numerical analysis of each of the derived experimental points; e) constructing a surrogate model through machine learning for the input value; and f) deriving an optimal design of the two-vane pump for wastewater from the constructed surrogate model.

6 Claims, 14 Drawing Sheets

(51) Int. Cl.
*F04D 7/04* (2006.01)
*F04D 29/22* (2006.01)
*F04D 29/30* (2006.01)
*F04D 29/44* (2006.01)
*G06F 30/17* (2020.01)
*G06N 3/086* (2023.01)

(52) U.S. Cl.
CPC .............. *F04D 29/30* (2013.01); *G06F 30/17* (2020.01); *G06F 30/27* (2020.01); *G06N 3/086* (2013.01)

(56) References Cited

OTHER PUBLICATIONS

Djerroud et al. "Numerical Identification of Key Design Parameters Enhancing the Centrifugal Pump Performance: Impeller, Impeller-Volute, and Impeller-Diffuser", ISRN ME, 2011, pp. 17.*
Tae Eun Lim et al., "Numerical Analysis of Flow Fields for Optimum Design of Vehicle Vacuum Pump with Multivanes", The Korean Society of Mechanical Engineers-B 35(9), Sep. 2011, 883-890 (8 pages).
Bo-Min Cho, "A Study on Numerical Optimization of Flow Path Cross-sectional Area to Improve the Hydraulic Performance of a Single-channel Pump", University of Science and Technology, Feb. 2017 [English Abstract is provided].

* cited by examiner

INLET

OUTER SIDE

VOLUTE AREA DISTRIBUTION CONTROL

|    | Beta1    | Beta2    | Vol_A   | Head    | Eff     | Solid   |
|----|----------|----------|---------|---------|---------|---------|
| 1  | -2       | -5       | 80      | 12.0332 | 70.9628 | 904.779 |
| 2  | 2        | -5       | 80      | 11.9872 | 69.9105 | 9202.77 |
| 3  | -2       | 1        | 80      | 12.3183 | 68.4466 | 904.779 |
| 4  | 2        | 1        | 80      | 12.2991 | 67.9661 | 10306   |
| 5  | -2       | -5       | 100     | 11.5804 | 66.5482 | 904.779 |
| 6  | 2        | -5       | 100     | 11.6938 | 66.5628 | 9202.77 |
| 7  | -2       | 1        | 100     | 11.9397 | 63.3094 | 904.779 |
| 8  | 2        | 1        | 100     | 11.8559 | 64.6209 | 10306   |
| 9  | -3.36359 | -2       | 90      | 0.16372 | 0.921226| 33.5103 |
| 10 | 3.36359  | -2       | 90      | 11.6761 | 62.0812 | 14137.2 |
| 11 | 0        | -7.04538 | 90      | 11.6104 | 71.8703 | 4188.79 |
| 12 | 0        | 3.04538  | 90      | 12.4809 | 65.7945 | 4849.05 |
| 13 | 0        | -2       | 73.182  | 12.4114 | 72.799  | 4188.79 |
| 14 | 0        | -2       | 106.818 | 11.6277 | 67.1154 | 4188.79 |
| 15 | 0        | -2       | 90      | 11.9871 | 66.5335 | 4188.79 |

(a) Spread constant for $H_t$ (b) Spread constant for $\eta$ (c) Spread constant for $V_s$

| | Design variables | | | Predicted values | | | RANS | | |
|---|---|---|---|---|---|---|---|---|---|
| | Beta1 | Beta2 | Vol_A | H | Efficiency | Solid | H | Eff | Solid |
| AOD 1 | 3.339001 | 2.857618 | 73.58096 | 11.6391 | 71.401 | 17757.2 | 12.1619 | 69.158 | 17157.3 |
| AOD 2 | 2.810056 | -7.02443 | 73.26591 | 11.5816 | 74.300 | 13113.7 | 11.7702 | 74.914 | 10306.0 |
| AOD 3 | 1.879493 | -6.9367 | 73.37992 | 11.6375 | 75.743 | 9693.3 | 11.7728 | 75.934 | 8181.2 |
| AOD 4 | 0.297569 | -6.9013 | 73.75858 | 11.7187 | 76.786 | 5207.1 | 11.6925 | 76.810 | 4849.0 |
| AOD 5 | -0.36792 | -6.67629 | 73.77092 | 11.7635 | 76.479 | 3735.0 | 11.7431 | 75.716 | 3591.4 |

3-D Geometry (a) Reference(b) Optimum

Cross-sectional area distribution

Specific speed ($N_s$)

(a) Reference
$N_s = 946$ (US unit)

(b) Optimum
$N_s = 1305$ (US unit)

$N_s$, Specific Speed, $\dfrac{N(rpm) \times \sqrt{Q(gpm)}}{[\Delta H(ft)]^{3/4}} = 2733 \times \Omega_s$ (a) Reference (b) Optimum (a) Reference (b) Optimum (a) Reference     (b) Optimum (a) Reference     (b) Optimum

TWO-VANE PUMP AND DESIGN METHOD OF TWO-VANE PUMP FOR WASTEWATER USING MACHINE LEARNING

BACKGROUND OF THE DISCLOSURE

Field of the Disclosure

The present disclosure relates to a two-vane pump for wastewater and a design method of a two-vane pump for wastewater using machine learning, and more particularly, a design method of a two-vane pump using machine learning capable of having a high efficiency of a target head and performing optimal design for sizes of passable solids and a two-vane pump for wastewater according to the machine learning.

Related Art

In general, a wastewater pump is a pump that transports sewage, wastewater sludge, and the like, and is widely used in various industrial fields.

Unlike a general submersible pump, the wastewater pump has to move a fluid containing foreign substances, and thus clogging of a flow path occurs frequently. As such, the clogging of the flow path may reduce performance, such as pump efficiency, of the wastewater pump, or may cause malfunction or damage of the wastewater pump. Therefore, it is important to design the wastewater pump so that the clogging does not occur.

A vortex pump is designed to prevent clogging of the flow path of the wastewater pump to which a conventional impeller having a plurality of flow paths is applied, a length of the impeller is shortened to secure a wide flow path, and thus, the clogging of the flow path is prevented. However, as the length of the impeller is shortened, the vortex pump has a problem in that the pump efficiency is only about 30% lower than that of the conventional wastewater pump.

A single channel pump forms one flow path inside the impeller, and the flow path rotates together according to the rotation of the impeller to transport wastewater. Accordingly, the single channel pump has an advantage in that pump efficiency is more than twice that of the vortex pump without clogging the flow path. However, since an impeller of the single channel pump has an asymmetric structure unlike a general impeller, when operating the single channel pump, there is a problem that a distribution of a fluid force is not constant, and thus, vibrations occur greatly, and particularly, in order to increase the pump efficiency, the vibration increases significantly, and thus, it is difficult to apply the single channel pump to a field.

A two-vane pump has two impellers in a symmetrical structure, and thus, has an advantage of passing solid materials better than a general vortex pump because of low vibrations and a wide flow path.

However, in the related art, there is no technology for designing a structure of an impeller so as to have a target efficiency for a desired head and a size of a passable solid, and thus, there is a problem in that a lot of trial and error has to be experienced in manufacturing a desired specification.

Therefore, a design technology is required, which considers an interaction between an impeller and a volute of the two-vane pump that can maximize the pump efficiency while satisfying a target head and the size of the passable solid.

SUMMARY

The present disclosure provides a design method of a two-vane pump using machine learning capable of having a high efficiency of a target head and performing optimal design for sizes of passable solids and a two-vane pump for wastewater according to the machine learning.

Objects of the present disclosure are not limited to the above-described objects, and other technical objects not mentioned above are clearly understood by those with ordinary knowledge in the technical field to which the present disclosure belongs from the description below.

According to an aspect of the present disclosure, there is provided a two-vane pump for wastewater including a circular volute having one inlet and one outlet, and a pair of impellers configured to rotate inside the volute and formed in a symmetrical streamline shape with respect to a rotation center to guide a flow of a fluid introduced into the volute, in which the pair of impellers are spaced apart from each other by a preset distance so that solids contained in wastewater pass through.

The inlet and outlet of the volute may be formed in a perpendicular direction toward different planes.

The volute may be formed such that a cross-sectional area gradually increases from a side of the inlet to a side of the outlet.

The pair of impellers may have a curve which is formed in a semicircular shape so that a surface on a pump inlet side is concave in a streamlined shape from the pump inlet, and extends to an outside of the volute.

The impeller may include a first point on the inlet side and may be configured so that a volume of a solid passing through the pump is changed according to a value of the closest displacement from the first point to the other facing impeller.

The impeller may include a second point on the outlet side and may be configured so that a head of the pump is changed according to a value of the closest displacement from the second point to the other facing impeller.

According to another aspect of the present disclosure, there is provided a design method of two-vane pump for wastewater using machine learning, the design method including a) setting an objective function, b) setting design variables of the impeller and volute for deriving the set objective function and a range of each design variable, c) deriving a plurality of experimental points including values of the design variables within the range of the design variable, d) generating an input value by calculating the value of the objective function through numerical analysis of each of the derived experimental points, e) constructing a surrogate model through machine learning for the input value, and f) deriving an optimal design of the two-vane pump for wastewater from the constructed surrogate model.

In a), the objective function may be the head, efficiency, and a maximum volume of passable solids.

The design variable may include a first variable which is a y-axis displacement of one end of the impeller located on the inlet side of the wastewater pump, a second variable that is a y-axis displacement of the other end of the impeller, and a third variable that is a cross-sectional area according to a volute angle of the volute.

In c), the experimental point may be derived by Latin Hypercube Sampling.

In d), the input value may include a value of the design variable constituting the experimental point and a value of the objective function calculated through numerical analysis for the value of the design variable.

In e), the surrogate model may be constituted by a radial basis neural network (RBNN) artificial neural network.

The e) may include e1) deriving a variable value for constructing the surrogate model through machine learning for the input value, and e2) constructing the surrogate model using the derived variable values.

The e1) may include i) dividing the input value into K separated subsets, ii) selecting test folds that do not overlap with each other from the divided subsets, iii) training the surrogate model by performing machine learning only with a training fold, which is a portion excluding the test fold from each of the subsets, iv) deriving a relative error by comparing a predicted value of the surrogate model trained with the training fold with an actual value of the test fold for each of the subsets, v) summing the relative errors derived from the K subsets to derive a relative error sum, and vi) repeatedly performing the dividing to the deriving of the relative error sum so that the variable value at which the relative error sum is the minimum is derived.

In e1), the variable value may include weight, the number of neurons, and a spread constant.

The f) may include f1) predicting the objective function value by substituting a randomly selected design variable value in the surrogate model into a genetic algorithm, f2) deriving a pareto-optimal front surface in consideration of a correlation between the predicted objective function values, and f3) deriving an optimal design of the two-vane pump for wastewater that is s design variable value for a target design function value in the derived pareto-optimal front surface.

DESCRIPTION OF EXEMPLARY EMBODIMENTS

Figure 1:
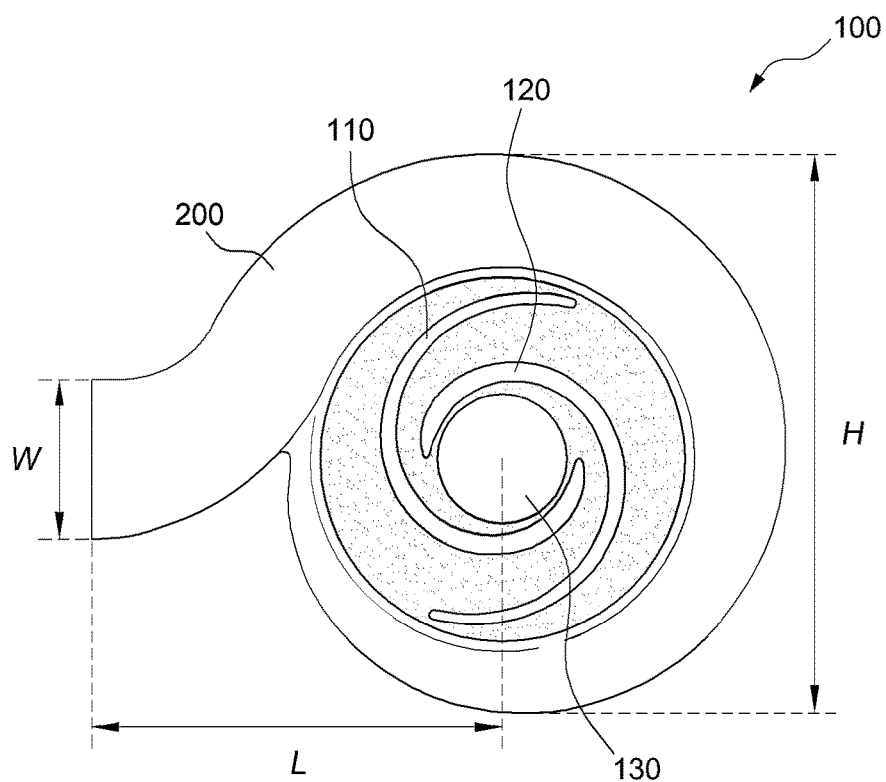
FIG. 1 is an exemplary diagram of a two-vane pump for wastewater using machine learning according to one embodiment of the present disclosure.

Hereinafter, the present disclosure will be described with reference to the accompanying drawings. However, the present disclosure may be implemented in several different forms, and thus is not limited to the embodiments described herein. Moreover, in order to clearly explain the present disclosure in the drawings, parts irrelevant to the description are omitted, and similar reference numerals are attached to similar parts throughout the specification.

Throughout the specification, when it is said that a portion is "connected (joined, contacted, coupled)" with another portion, it is not only "directly connected" but also "indirectly connected" with another member interposed therebetween. Moreover, when a portion "includes" a certain component, it means that other components may be further included, rather than excluding other components, unless otherwise stated.

The terms used herein are used only to describe specific embodiments, and are not intended to limit the present disclosure. A singular expression includes a plural expression unless the context clearly dictates otherwise. In the present specification, terms such as "comprise" or "have" are intended to designate that a feature, number, step, operation, component, part, or combination thereof described in the specification exists, and it is understood that terms such as "comprise" or "have" do not preclude the existence or addition of one or more other features or numbers, steps, operations, components, parts, or combinations thereof.

Hereinafter, embodiments of the present disclosure will be described in detail with reference to the accompanying drawings.

FIG. 1 is an exemplary diagram of a two-vane pump for wastewater using machine learning according to one embodiment of the present disclosure.

Referring to FIG. 1, a two-vane pump 100 for wastewater designed according to a
design method of the two-vane pump for wastewater using machine learning of the present disclosure includes a pair of impellers 110 and 120 and a volute 200. Here, the pair of impellers 110 and 120 may be provided to be symmetrical to each other, and may be provided to extend outwardly from a pump inlet 130 in a streamlined shape.

More specifically, the pair of impellers 110 and 120 is formed to extend outwardly of the volute 200 while drawing a streamlined curve from the inlet 130. In this case, the impellers 110 and 120 may be formed to extend to form a curve so that a surface on the inlet 130 side is concave.

The volute 200 includes a hub 210 and a shroud 220, and may be provided to form a casing accommodating the impellers 110 and 120 therein.

In addition, the volute 200 is formed such that the cross-sectional area gradually increases from the inlet side toward the outlet side.

In the present disclosure, the two-vane pump 100 for wastewater designed according to the design method of the two-vane pump for wastewater using machine learning is a pump for 2.2 kW, and an outlet width (W) of the volute 200 may be 80 mm, a length L from a center of the inlet 130 to an outlet end of the volute 200 may be fixed at 200 mm, and a height H of the volute 200 may be within 300 mm.

Figure 2:
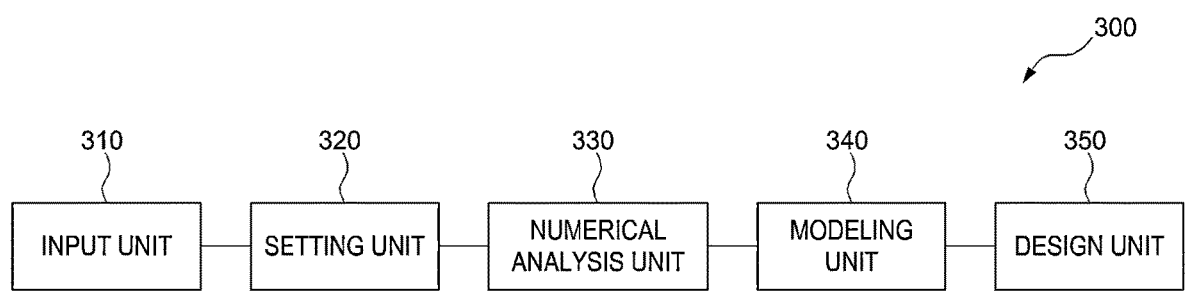
FIG. 2 is an exemplary diagram of a design system of the two-vane pump for wastewater using machine learning according to one embodiment of the present disclosure.

FIG. 2 is an exemplary diagram of a design system of the two-vane pump for wastewater using machine learning according to one embodiment of the present disclosure.

Referring to FIG. 2, a design system 300 of the design method of the two-vane pump for wastewater using machine learning includes an input unit 310, a setting unit 320, a numerical analysis unit 330, a modeling unit 340, and a design unit 350.

The input unit 310 may be provided to input an objective function, a design variable, and a range of each design variable.

The setting unit 320 may be provided to derive an experimental point within the range of the design variable input to the input unit 310.

The numerical analysis unit 330 may be provided to generate the input value by performing a numerical analysis on the experimental points derived from the setting unit 320.

The modeling unit 340 may be provided to construct a surrogate model by performing machine learning on the input value generated in the numerical analysis unit 330.

The design unit 350 may be provided to derive an optimal design of the two-vane pump 100 for wastewater designed according to the design method of the two-vane pump for wastewater using the machine learning from the modeling unit 340.

Hereinafter, the design method of the two-vane pump for wastewater using machine learning using the design system 300 of the design method of the two-vane pump for wastewater using machine learning will be described in detail.

Figure 3:
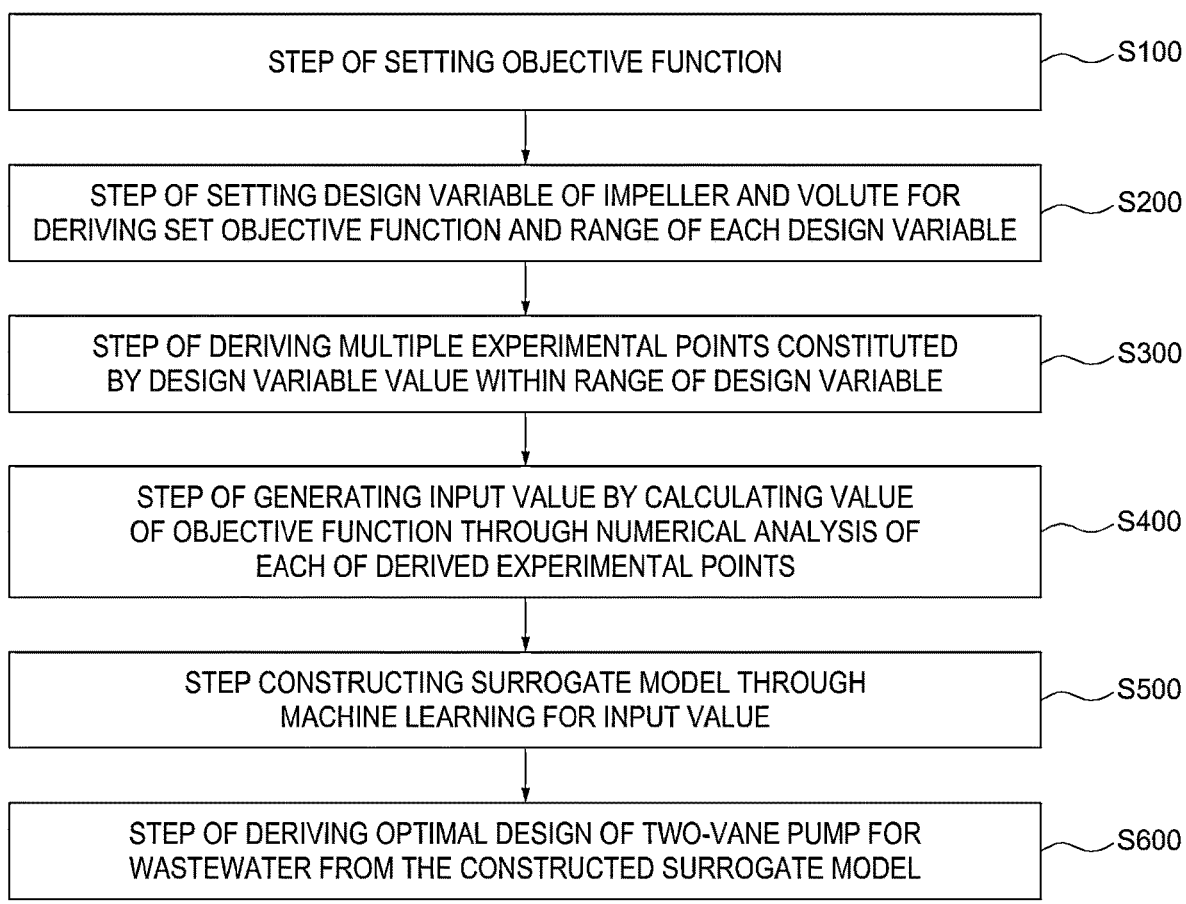
FIG. 3 is a flowchart of a design method of the two-vane pump for wastewater using machine learning according to one embodiment of the present disclosure.
Figure 4:
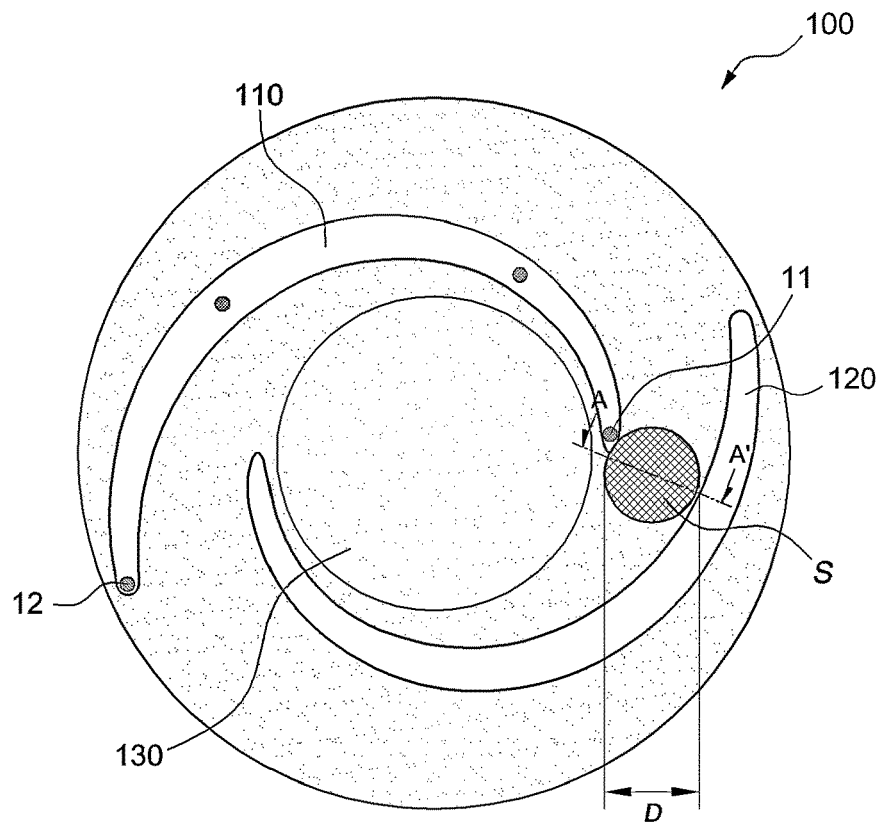
FIG. 4 is an exemplary diagram of a two-vane pump impeller for wastewater using machine learning according to one embodiment of the present disclosure.

FIG. 3 is a flowchart of the design method of the two-vane pump for wastewater using machine learning according to one embodiment of the present disclosure, and FIG. 4 is an exemplary diagram of a two-vane pump impeller for wastewater using machine learning according to one embodiment of the present disclosure.

Referring to FIGS. 3 and 4, in the design method of the two-vane pump for wastewater using machine learning, first, a step (S100) of setting the objective function may be performed.

In the step (S100) of setting the objective function, the objective function relates to a target specification, and in the present disclosure, a head, efficiency, and a maximum volume of passable solids may be set as the objective function.

Figure 5:
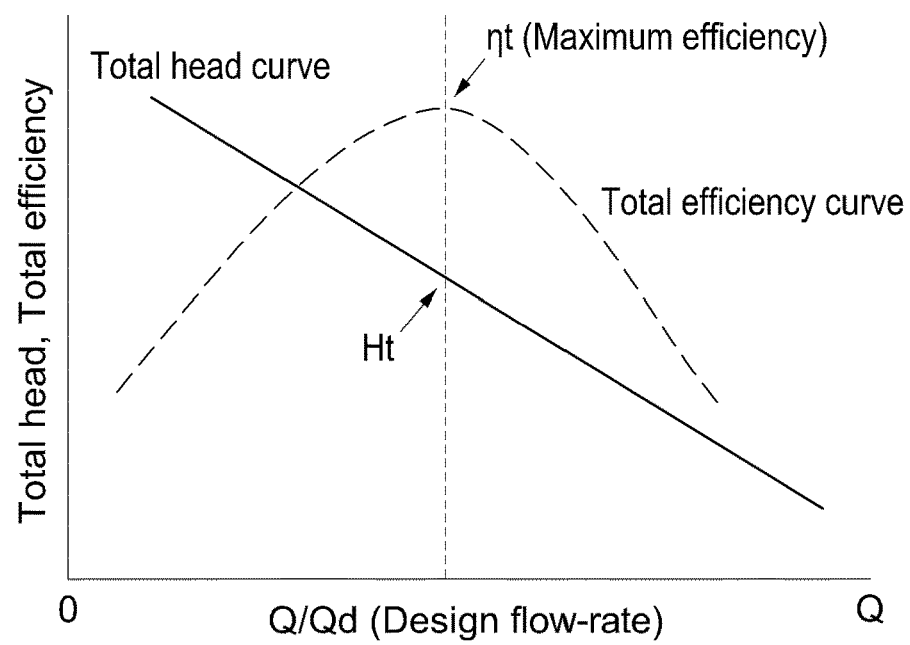
FIG. 5 is a graph illustrating a head and efficiency according to a flow ratio according to one embodiment of the present disclosure.

FIG. 5 is a graph illustrating the head and efficiency according to the flow ratio according to one embodiment of the present disclosure.

Referring to FIG. 5, in the two-vane pump 100 for wastewater designed according to the design method of the two-vane pump for wastewater using machine learning, graphs for the head and efficiency according to the flow rate ratio are not the same.

Specifically, looking at the graph of the head according to the flow ratio, the head decreases as the flow ratio increases.

Moreover, looking at the graph of the efficiency according to the flow ratio, there is a two-dimensional curve in which the efficiency increases as the flow ratio increases, and then decreases at a certain point.

In addition, in a case where only the head and the efficiency are calculated, even when a two-vane pump for wastewater having the maximum efficiency according to the head is designed, there is a high possibility of clogging by solids due to the characteristics of the wastewater pump.

Therefore, by considering the maximum size of passable solids in the objective function, it is necessary to design a design that allows solids to pass and derives maximum efficiency according to a target head.

Therefore, the head, the efficiency, and the maximum volume of the passable solids are set as the objective functions of the present disclosure.

The maximum volume of the passable solid may be calculated by the following Equation 1.

$$\text{Solid}_v = \frac{1}{6}\pi D^3 \qquad \text{[Equation 1]}$$

Here, D is a length in a tangential direction from an end of a pump inlet of an impeller to a facing impeller.

After the step (S100) of setting the objective function, a step (S200) of setting design variables of the impeller and the volute for deriving the set objective function and a range of each design variable may be performed.

Figure 6:
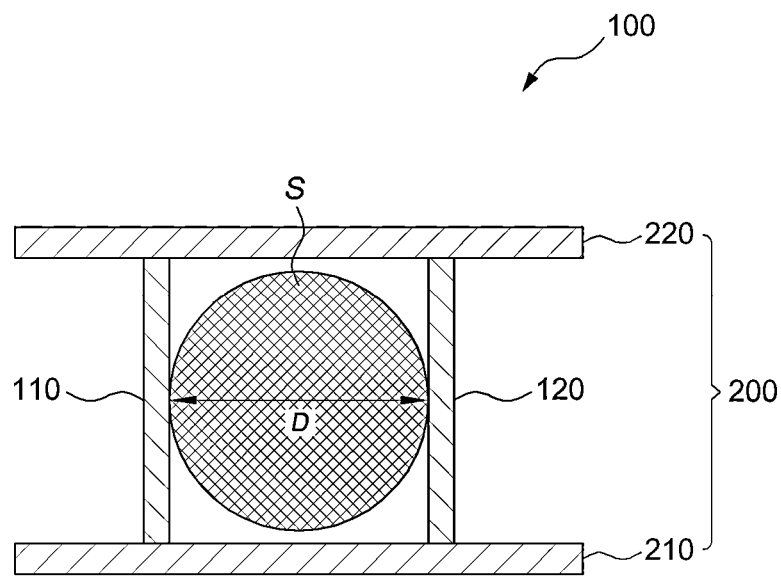
FIG. 6 is a cross-sectional view taken along line A-A' of FIG. 4 according to one embodiment of the present disclosure.

FIG. 6 is a cross-sectional view taken along line A-A' of FIG. 4 according to one embodiment of the present disclosure.

Referring further to FIG. 6, in the step (S200) of setting the design variables of the impeller and the volute for deriving the set objective function and the range of each design variable, as the design variable of the present disclosure, a total of three variables such as a first variable, a second variable, and a third variable are set.

Although the present disclosure describes a case in which the optimal design is performed by three design variables that have the greatest influence on the set objective function, the number of design variables is not limited thereto, and the number of design variables may be changed.

Figure 7:
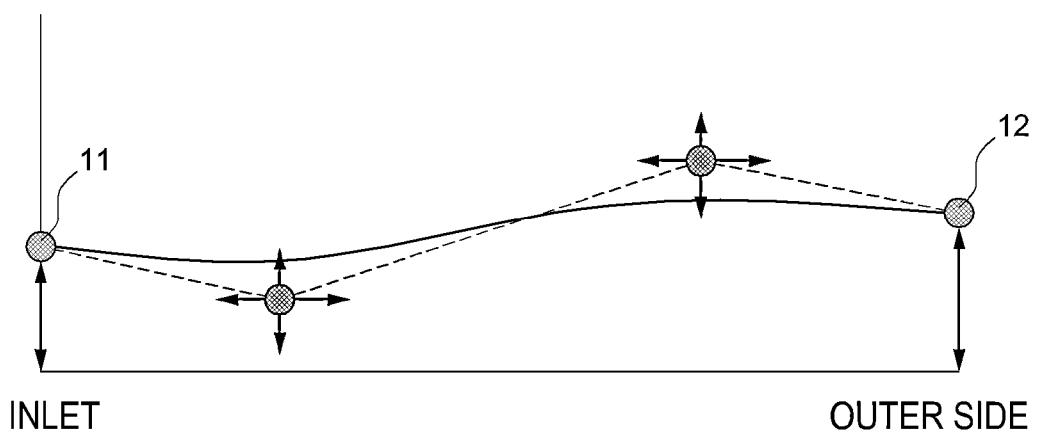
FIG. 7 is an exemplary view illustrating a point set as a design variable of an impeller according to one embodiment of the present disclosure.

FIG. 7 is an exemplary view illustrating a point set as a design variable of an impeller according to one embodiment of the present disclosure.

Referring to FIG. 7, the first variable refers to a y-axis displacement of a first point 11 located at one end of the impellers 110 and 120. In this case, one end of the impellers 110 and 120 means the inlet 130 side of the pump.

Moreover, the second variable refers to a y-axis displacement of a second point 12 located at the other end of the impellers 110 and 120.

Here, the first variable has the greatest influence on the passable solid size and efficiency among the shapes of the impeller, the second variable has the greatest influence on the head among the shapes of the impeller, and, thus, the first variable and the second variable are selected.

Figures 8, 9:
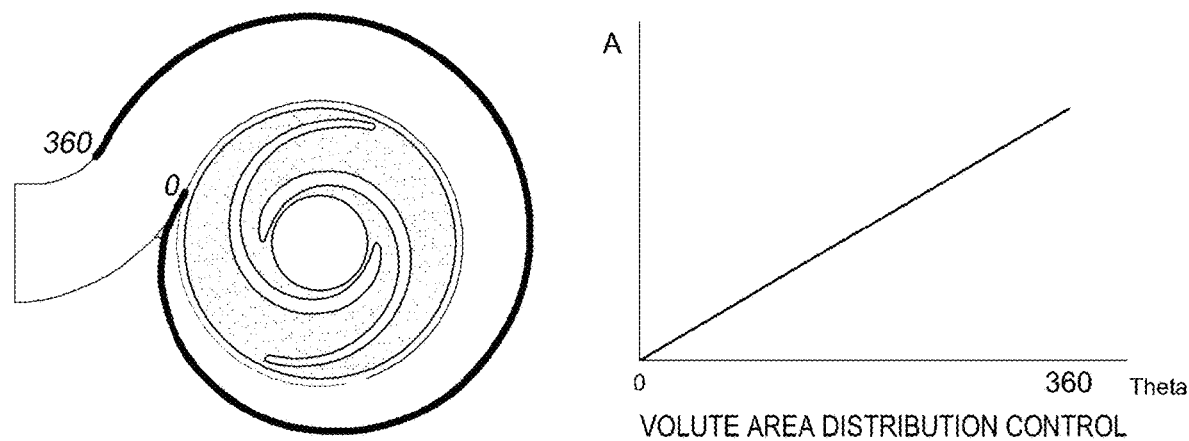
FIG. 8 is an exemplary diagram illustrating design variables of a volute according to one embodiment of the present disclosure.
FIG. 9 is a table illustrating an input value generated by calculating a value of an objective function through numerical analysis of experimental points according to one embodiment of the present disclosure.

FIG. 8 is an exemplary diagram illustrating design variables of a volute according to one embodiment of the present disclosure.

Referring to FIG. 8, the third variable refers to a ratio of a cross-sectional area to a maximum cross-sectional area at a point of 360° in a volute angle of the volute 200. Specifically, the volute 200 extends to surround an outer peripheral surface of the impeller, and is configured so that the cross-sectional area gradually increases from 0° to 360° in FIG. 8. In this case, the third variable may represent the size of the cross-sectional area of the volute 200 as a percentage compared to the cross-sectional area of the volute 200 initially set at a point of 360° where the cross-sectional area is the largest. For example, when the initially set arbitrary volute cross-sectional area is 100 mm and the third variable is 80%, an optimally designed volute cross-sectional area is 80 mm.

The third variable is set as the volute cross-sectional area because a relationship between the impeller outlet side and the volute cross-sectional area as well as a relationship between the impeller inlet 130 side and the volute cross-sectional area is important when designing the impeller and volute.

Moreover, in the step (S200) of setting the design variables of the impeller and the volute for deriving the set objective function and the range of each design variable, a step of setting the maximum and minimum value ranges for each design variable may be further provided.

The maximum and minimum value ranges for the design variable may be preset values in consideration of the sizes of the impeller and the volute, and may be set in a percentage range compared to the initial setting, but is not limited thereto.

In addition, it is preferable that the maximum and minimum ranges of the first to third variables are set so that an inflection point of a quadratic function is included within the ranges.

After the step (S200) of setting the design variables of the impeller and the volute for deriving the set objective function and the ranges of each design variable, a step (S300) of deriving a plurality of experimental points constituted by the design variable values within the range of the design variables may be performed.

In the step (S300) of deriving the plurality of experimental points constituted by the design variable values within the range of design variables, the plurality of experimental points may be derived by Latin Hypercube Sampling.

Here, each of the experimental points may be constituted by the value of the design variable, and in the embodiment of the present disclosure, 48 experimental points are derived by the Latin Hypercube Sampling method, but the number of the experimental points is not limited thereto.

After the step (S300) of deriving the plurality of experimental points constituted by the design variable values within the range of the design variables, a step (S400) of generating the input value by calculating the value of the objective function through numerical analysis of each of the derived experimental points may be performed.

FIG. 9 is a table illustrating the input value generated by calculating the value of the objective function through the numerical analysis of the experimental points according to one embodiment of the present disclosure.

Referring to FIG. 9, in the step (S400) of generating the input value by calculating the value of the objective function through numerical analysis of each of the derived experimental points, the input value may be derived by performing numerical analysis on the experimental points derived by the Latin Hypercube Sampling method to obtain the objective function value.

Here, as illustrated in the table of FIG. 9, the input value may be the value of the design variable constituting the experimental point and the values of the objective function calculated through numerical analysis of the value of the design variable.

In FIG. 9, values are illustrated only for 15 experimental points out of 48 experimental points.

After the step (S400) of generating the input value by calculating the value of the objective function through the numerical analysis of each of the derived experimental points, a step (S500) of constructing the surrogate model through machine learning for the input value may be performed.

In the step (S500) of constructing the surrogate model through machine learning for the input value, the surrogate model may be constituted by a radial basis neural network (RBNN) artificial neural network.

Specifically, the RBNN artificial neural network surrogate model will be described. The RBNN artificial neural network is one of the artificial neural network types, and is constituted by an input value, an output value, and a hidden layer.

Figure 10:
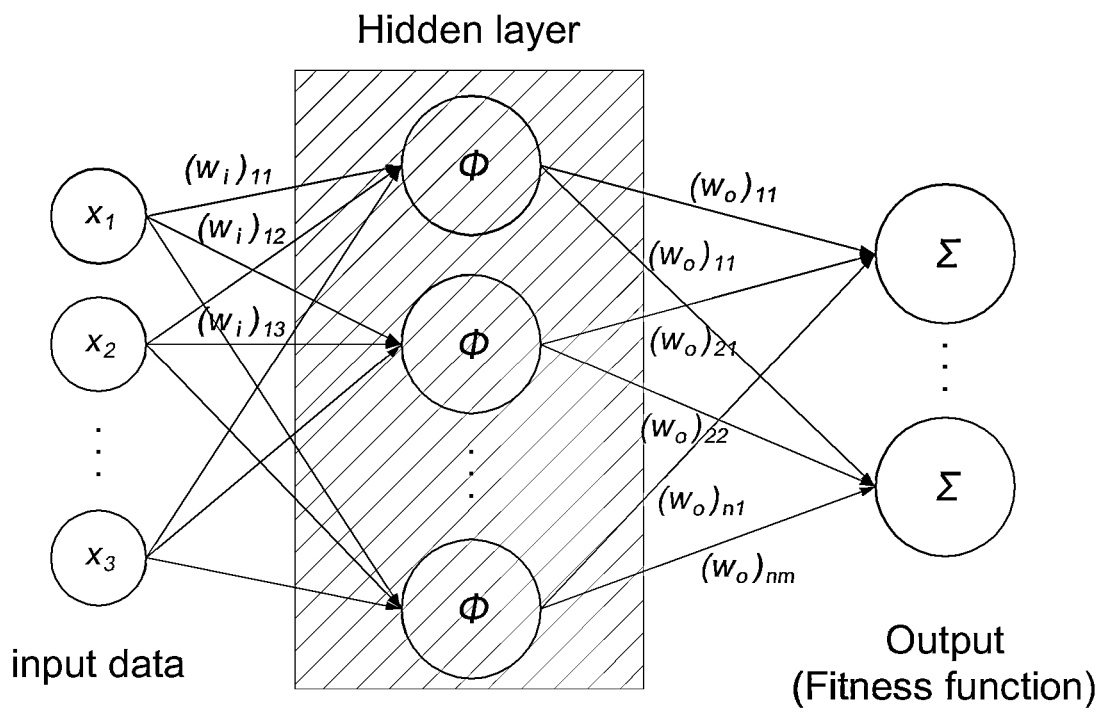
FIG. 10 is a schematic diagram illustrating a RBNN surrogate model according to one embodiment of the present disclosure.

FIG. 10 is a schematic diagram illustrating the RBNN surrogate model according to one embodiment of the present disclosure.

Referring further to FIG. 10, prediction accuracy of the RBNN artificial neural network depends on the hidden layer, and the hidden layers by the input value are constituted by neurons expressed by a radial basis transfer function as illustrated in the following Equation 2.

$$a = \text{radbas}(\|w_i - p\| b) \quad \text{[Equation 2]}$$

Here, wi is a weight, b is a bias, and p is an input vector. The radial basis function (radbas) is expressed by the following Equation 3.

$$\text{radbas}(n) = e^{-n^2} \quad \text{[Equation 3]}$$

Each neuron is output in a linear combination by combining the output weights, and may be expressed as in the following Equation 4.

$$f(x) = \sum_{j=1}^{N} (w_0)_j \emptyset_j \quad \text{[Equation 4]}$$

Here, $(w_0)_j$ is the weight, and $\emptyset_j$ is the radial basis function.

When the RBNN artificial neural network surrogate model prepared in this way is used, the calculation and prediction time can be reduced due to the linearity of the output value.

Figure 11:
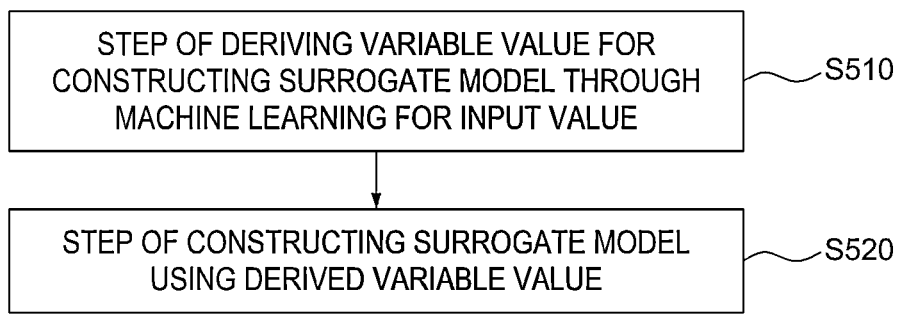
FIG. 11 is a flowchart of a step in which a surrogate model is constructed through machine learning for an input value according to one embodiment of the present disclosure.

FIG. 11 is a flowchart of a step in which the surrogate model is constructed through machine learning for an input value according to one embodiment of the present disclosure.

Referring to FIG. 11, the step (S500) of constructing the surrogate model through machine learning for the input value will be described in more detail.

In the step (S500) of constructing the surrogate model through machine learning for the input value, first, a step (S510) of deriving variable values for constructing the surrogate model through machine learning for the input value may be performed.

In the step (S510) of deriving the variable value for constructing the surrogate model through machine learning for the input value, the variable value may include a weight (wi, wo), the number of neurons (n), and a spread constant (SC).

Figure 12:
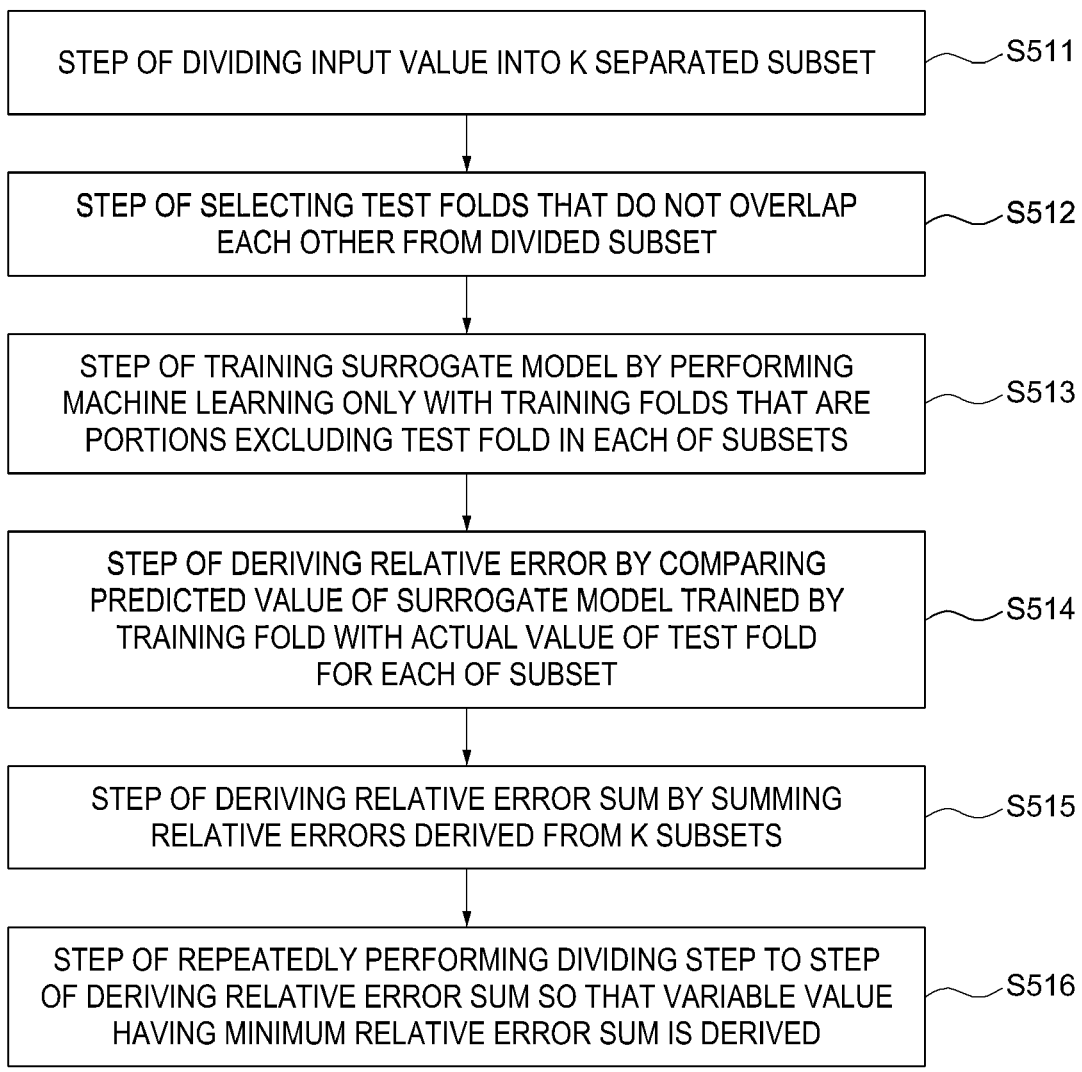
FIG. 12 is a flowchart of a step of deriving a variable value for constructing the surrogate model through machine learning for an input value according to one embodiment of the present disclosure.
Figure 13:
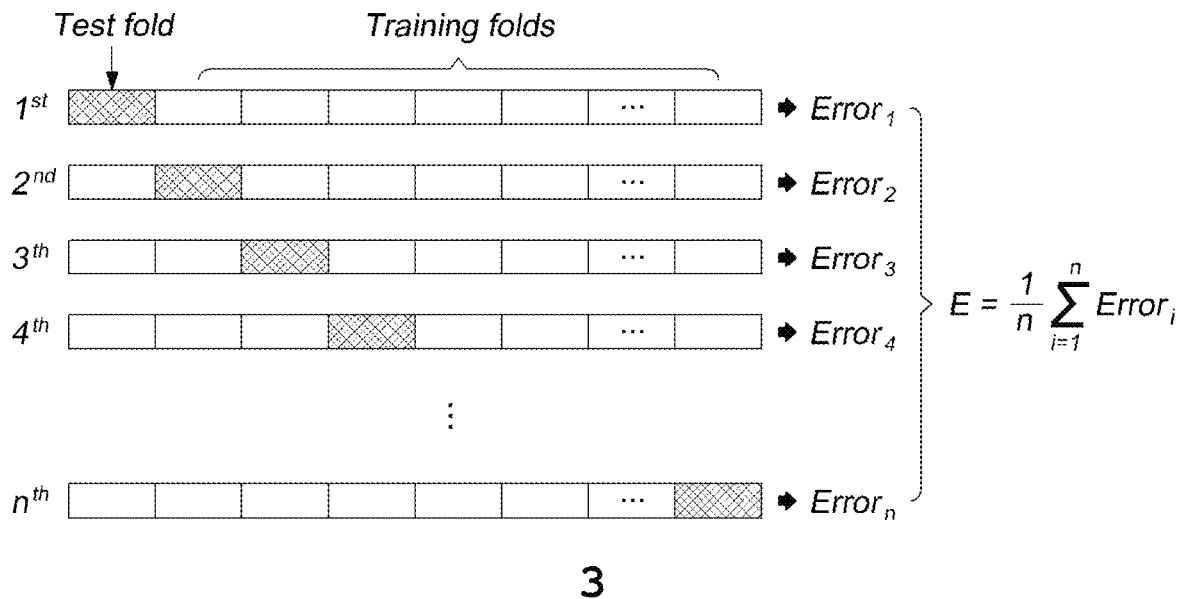
FIG. 13 is an exemplary diagram of a step of deriving the variable value for constructing the surrogate model through machine learning for the input value according to one embodiment of the present disclosure.

FIG. 12 is a flowchart of a step of deriving the variable value for constructing the surrogate model through machine learning for an input value according to one embodiment of the present disclosure, and FIG. 13 is an exemplary diagram of a step of deriving the variable value for constructing the surrogate model through machine learning for the input value according to one embodiment of the present disclosure.

In the step (S510) of deriving the variable value for constructing the surrogate model through machine learning for the input value, first, a step (S511) of dividing the input value into K separated subsets may be performed.

In the step (S511) of dividing the input value into the K separated subsets, as illustrated in FIG. 13, the input value may be divided into the K separated subsets.

In this case, K may be provided to be equal to the number of input values. As an example, when the input value including the design variable value and the objective function value is 48, the number of subsets may also be 48.

After the step (S511) of dividing the input value into the K separated subsets, a step (S512) of selecting test folds that do not overlap each other from the divided subsets may be performed.

In the step (S512) of selecting the test folds that do not overlap each other from the divided subsets, test folds may be selected so as not to overlap each other in each subset.

For example, in a first subset, a first input value may be selected as the test fold, and in a second subset, a second input value may be selected as the test fold.

After the step (S512) of selecting the test folds that do not overlap each other in the divided subsets, a step (S513) of training the surrogate model by performing machine learning only with training folds that are portions excluding the test folds in each of the subsets may be performed.

In each of the subsets, in the step (S513) of training the surrogate model by performing machine learning only with the training folds which are portions excluding the test fold, machine learning may be performed only with the training fold in each subset.

For example, when the first input value in the first subset is a test fold, the remaining input values become training folds. Moreover, it is possible to train the RBNN artificial neural network surrogate model by performing machine learning only with the training fold prepared in this way. In this case, the machine learning may be performed by changing the above variables, such as the weight ($w_i$, $w_o$), the number of neurons (n), and the spread constant (SC).

After the step (S513) of training the surrogate model by performing machine learning only with the training folds which are portions excluding the test fold in each of the subsets, a step (S514) of deriving a relative error by comparing the predicted value of the surrogate model trained by the training fold with the actual value of the test fold for each of the subset may be performed.

In the step (S514) of deriving the relative error by comparing the predicted value of the surrogate model trained by the training fold with the actual value of the test fold for each of the subset, the predicted value of the test fold is calculated using the surrogate model trained with the training fold, and the relative error is derived by comparing the predicted value with the actual value of the test fold.

After the step (S514) of deriving the relative error by comparing the predicted value of the surrogate model trained by the training fold with the actual value of the test fold for each of the subset, a step (S513) of deriving a relative error sum by summing the relative errors derived from the K subsets may be performed.

In the step (S515) of deriving the relative error sum by summing the relative errors derived from the K subsets, the relative error sum may be derived by summing the relative errors derived from each subset.

After the step (S515) of deriving the relative error sum by summing the relative errors derived from the K subsets, a step (S516) of repeatedly performing the dividing step to the step of deriving the relative error sum so that the variable value having the minimum relative error sum is derived may be performed.

In the step (S516) of repeatedly performing the dividing step to the step of deriving the relative error sum so that the variable value having the minimum relative error sum is derived, the step (S511) of dividing the input value into K separated subsets to find a variable having the minimum relative error sum to the step (S515) of deriving the relative error sum by summing the relative errors derived from the subset may be repeatedly performed.

Figure 14:
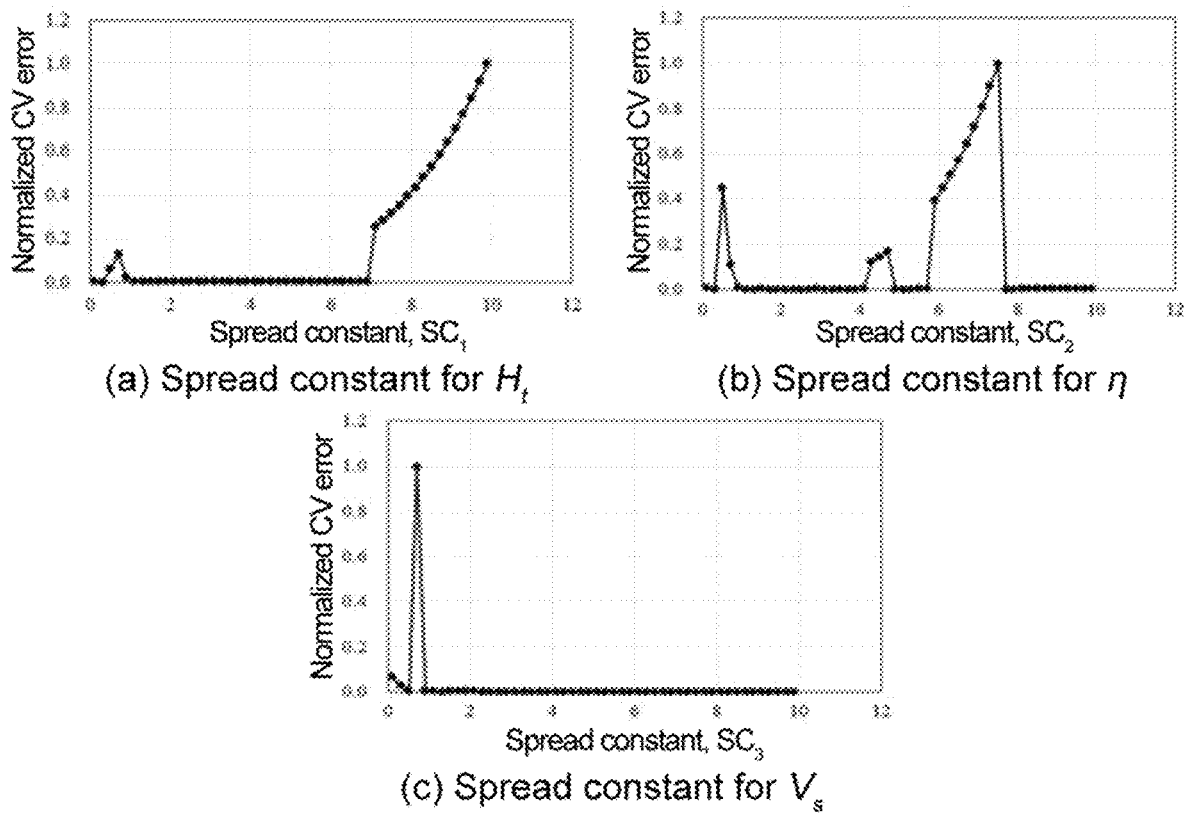
FIG. 14 is a graph illustrating a value of a spread constant according to a cross-validation error for the objective function according to one embodiment of the present disclosure.

FIG. 14 is a graph illustrating a value of a spread constant according to a cross-validation error for the objective function according to one embodiment of the present disclosure.

As illustrated in FIG. 14, in one embodiment of the present disclosure, a value which minimizes the summation relative error of the RBNN model for each objective function is selected while changing the value of the learned spread constant, which is a variable, from 0.1 to 10.

SC1, SC2, and SC3 indicated in FIG. 14 represent spread constant values for the head, the efficiency, and the passable solids size, respectively. Moreover, in the embodiment of the present disclosure, the SC1, SC2 and SC3 values finally learned according to the step (S510) of deriving the variable values for constructing the surrogate model through machine learning for the input values are 0.3, 1.9, and 9.9, respectively.

After the step (S51) of deriving the variable value for constructing the surrogate model through machine learning for the input value, a step (S520) of constructing the surrogate model using the derived variable value may be performed.

In the step (S520) of constructing the surrogate model using the derived variable values, the RBNN artificial neural network surrogate model may be constructed using the derived variable values.

After the step (S500) of constructing a surrogate model through machine learning for the input value, a step (S600) of deriving an optimal design of a two-vane pump for wastewater from the constructed surrogate model may be performed.

Figure 15:
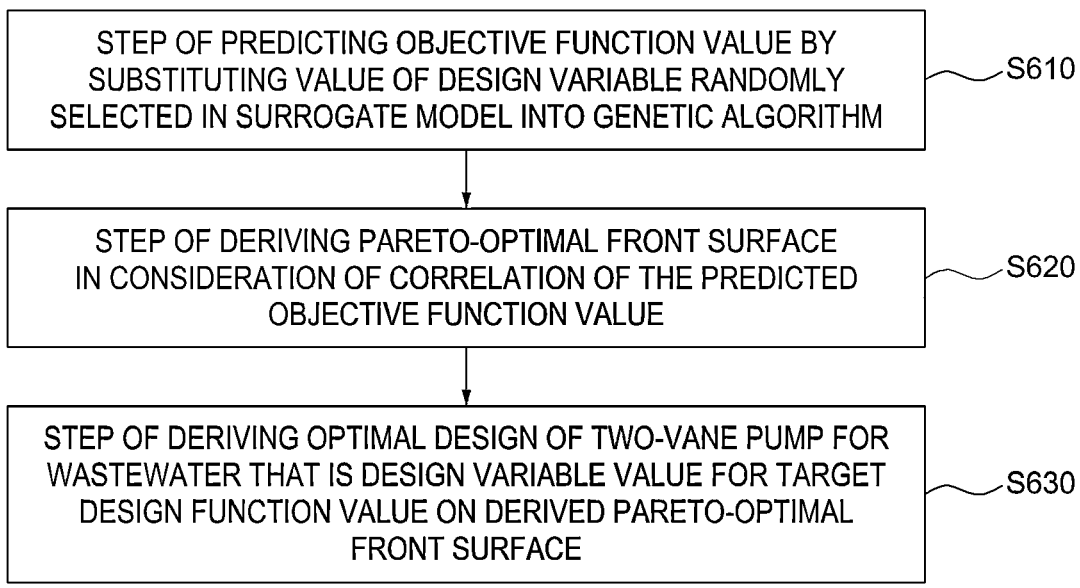
FIG. 15 is a flowchart of a step of deriving an optimal design of the two-vane pump for wastewater in the surrogate model constructed according to one embodiment of the present disclosure.
Figure 16:
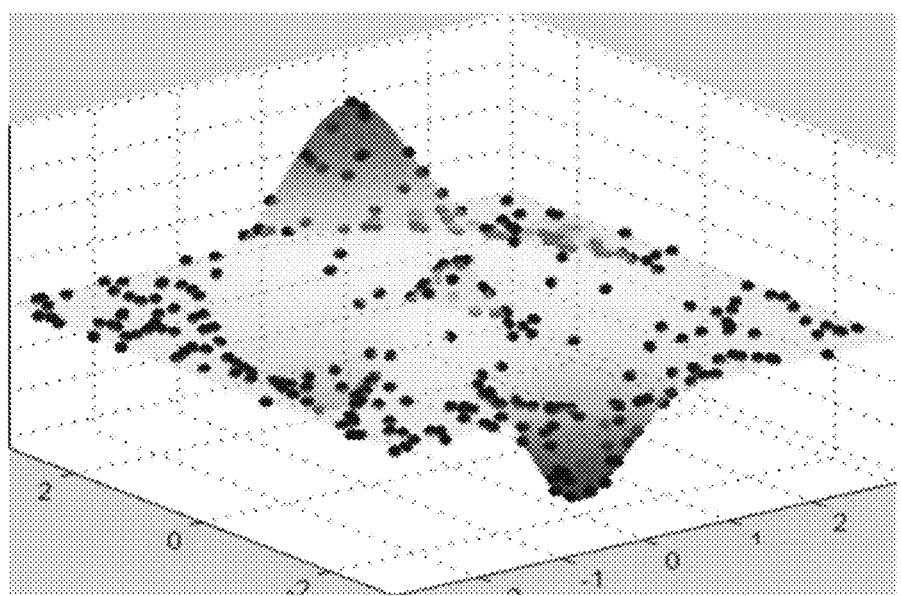
FIG. 16 is a graph illustrating objective function values predicted according to a genetic algorithm according to one embodiment of the present disclosure.
Figure 17:
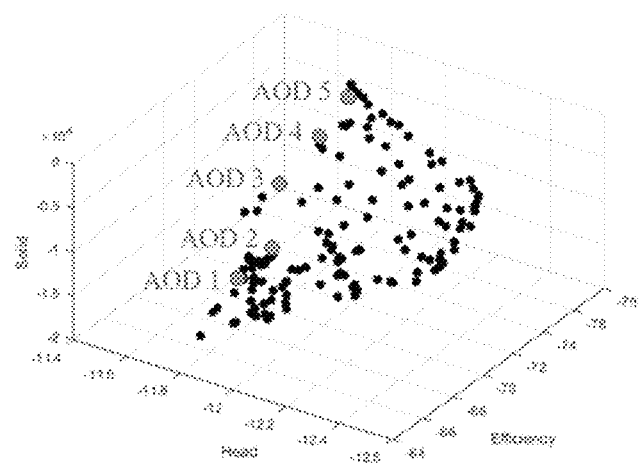
FIG. 17 is a graph derived from a pareto-optimal front surface according to one embodiment of the present disclosure.

FIG. 15 is a flowchart of a step of deriving an optimal design of the two-vane pump for wastewater in the surrogate model constructed according to one embodiment of the present disclosure, FIG. 16 is a graph illustrating objective function values predicted according to a genetic algorithm according to one embodiment of the present disclosure, and FIG. 17 is a graph derived from a pareto-optimal front surface according to one embodiment of the present disclosure.

Referring FIGS. 15 to 17, in the step (S600) of deriving the optimal design of the two-vane pump for wastewater from the constructed surrogate model, first, a step (S610) of predicting the objective function value by substituting a value of a design variable randomly selected in the surrogate model into a genetic algorithm may be performed.

In the step (S610) of predicting the objective function value by substituting the value of the design variable randomly selected in the surrogate model into the genetic algorithm, the genetic algorithm is a search technique developed by mimicking the way that evolves in nature.

Specifically, in the step (S610) of predicting the objective function value by substituting the value of the design variable randomly selected in the surrogate model into the genetic algorithm, first, a plurality of populations can be selected by randomly selecting design variables in the surrogate model. Then, the populations are selected, mutated, and cross-calculated according to the genetic algorithm, and the predictive objective function value according to the design variable is repeatedly performed until the relative error with the actual objective function value is 1×10-8 or less.

After the step (S610) of predicting the objective function value by substituting the value of the design variable randomly selected in the surrogate model into the genetic algorithm, a step (S620) of deriving a pareto-optimal front surface in consideration of the correlation of the predicted objective function values may be performed.

In the step (S620) of deriving a pareto-optimal front surface in consideration of the correlation of the predicted objective function values, as illustrated in FIG. 17, a line or plane that forms a Pareto optimal solution is derived by considering the correlation between predicted objective function values.

After the step (S620) of deriving a pareto-optimal front surface in consideration of the correlation of the predicted objective function values, a step (S630) of deriving an optimal design of a two-vane pump for wastewater that is the design variable value for a target design function value on the derived pareto-optimal front surface may be performed.

In the step (S630) of deriving the optimal design of the two-vane pump for wastewater that is the design variable value for a target design function value on the derived pareto-optimal front surface, the optimal design is derived by deriving a design variable to have an objective design function value from the pareto-optimal front surface.

Figure 18:
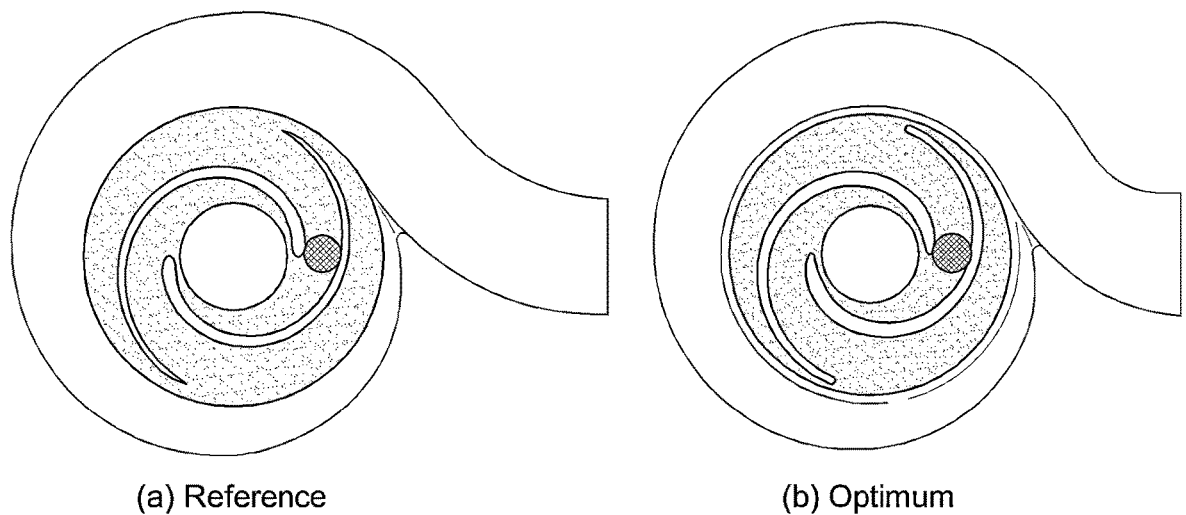
FIG. 18 is an exemplary diagram comparing a volute cross-sectional area ratio of a two-vane pump for wastewater according to the related art and a volute cross-sectional area ratio of the two-vane pump for wastewater designed according to the design method of the two-vane pump for wastewater using machine learning according to one embodiment of the present disclosure.
Figure 18:
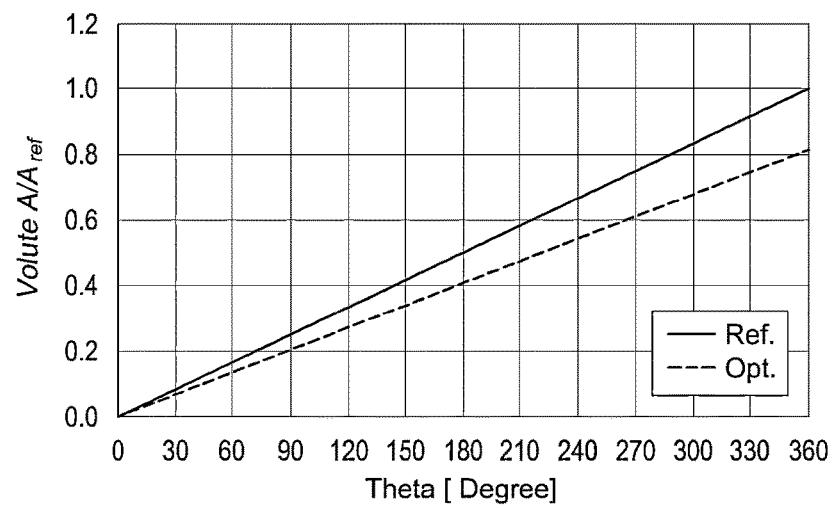

FIG. 18 is an exemplary diagram comparing a volute cross-sectional area ratio of a two-vane pump for wastewater according to the related art and a volute cross-sectional area ratio of the two-vane pump for wastewater designed according to the design method of the two-vane pump for wastewater using machine learning according to one embodiment of the present disclosure.

Referring to FIG. 18, the two-vane pump 100 for wastewater designed according to the design method of the two-vane pump for wastewater using machine learning according to the present disclosure has a smaller cross-section of the volute casing compared to the two-vane pump for wastewater of the related art, and thus, it can be seen that the cross-sectional shape is changed.

Figure 19:
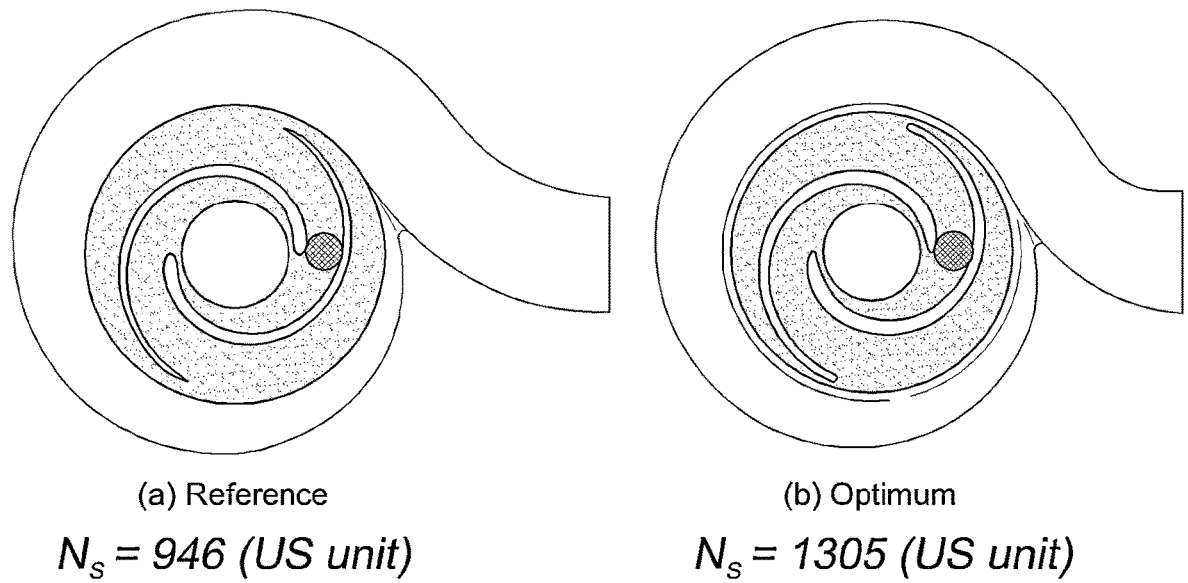
FIG. 19 is an exemplary diagram comparing a flow rate of the two-vane pump for wastewater according to the related art and a flow rate of the two-vane pump for wastewater designed according to the design method of the two-vane pump for wastewater using machine learning according to one embodiment of the present disclosure.
Figure 19:
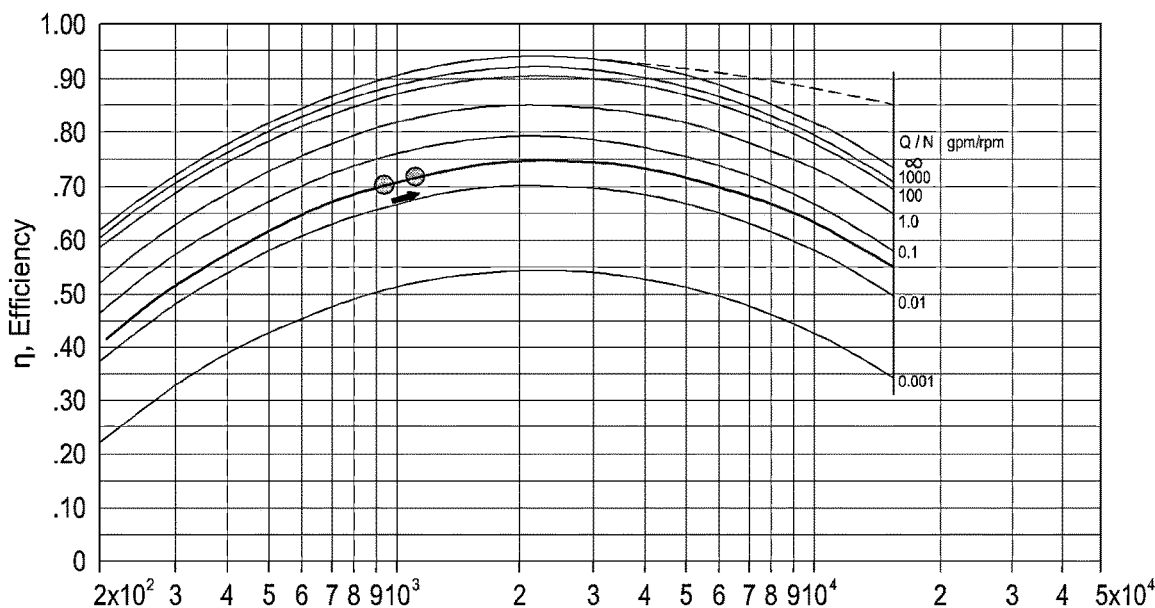

FIG. 19 is an exemplary diagram comparing a flow rate of the two-vane pump for wastewater according to the related art and a flow rate of the two-vane pump for wastewater designed according to the design method of the two-vane pump for wastewater using machine learning according to one embodiment of the present disclosure.

Referring to FIG. 19, it can be seen that the two-vane pump 100 for wastewater designed according to the design method of the two-vane pump for wastewater using machine learning according to the present disclosure increases in flow rate compared to the two-vane pump for wastewater of the related art.

Figure 20:
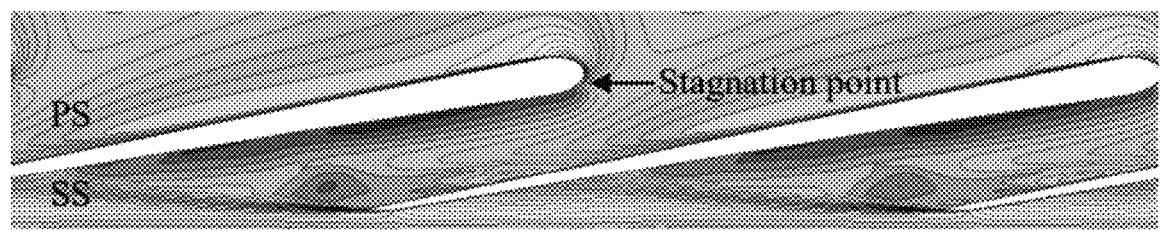
FIG. 20 is an exemplary diagram comparing a flow rate at an impeller span in the two-vane pump for wastewater according to the related art and a flow rate at an impeller span in the two-vane pump for wastewater designed according to the design method of the two-vane pump for wastewater using machine learning according to one embodiment of the present disclosure.

FIG. 20 is an exemplary diagram comparing a flow rate at an impeller span in the two-vane pump for wastewater according to the related art and a flow rate at an impeller span in the two-vane pump for wastewater designed according to the design method of the two-vane pump for wastewater using machine learning according to one embodiment of the present disclosure.

Referring to FIG. 20, it can be seen that the two-vane pump 100 for wastewater designed according to the design method of the two-vane pump for wastewater using machine learning according to the present disclosure has a uniform flow rate distribution in the span region of the end of the impeller compared to the two-vane pump for wastewater of the related art.

Figure 21:
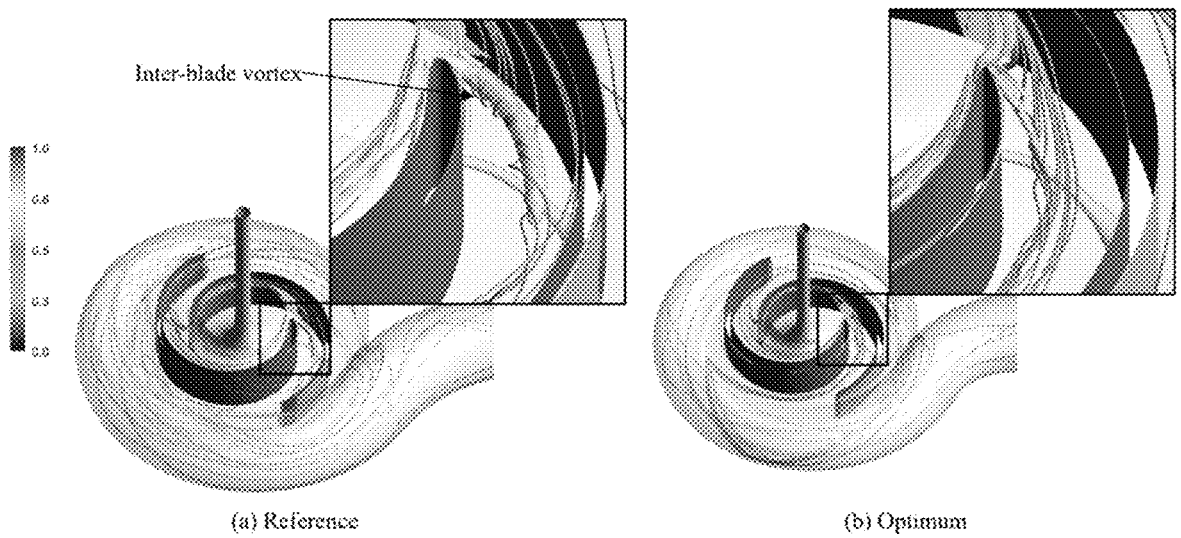
FIG. 21 is a streamline distribution diagram illustrating a vortex on an impeller inlet side in the two-vane pump for wastewater according to the related art and a vortex on an impeller inlet side in the two-vane pump for wastewater designed according to the design method of the two-vane pump for wastewater using machine learning according to one embodiment of the present disclosure.

FIG. 21 is a streamline distribution diagram illustrating a vortex on an impeller inlet side in the two-vane pump for wastewater according to the related art and a vortex on an impeller inlet side in the two-vane pump for wastewater designed according to the design method of the two-vane pump for wastewater using machine learning according to one embodiment of the present disclosure.

Referring to FIG. 21, it can be seen that compared to the two-vane pump for wastewater of the related art, in the two-vane pump 100 for wastewater designed according to the design method of the two-vane pump for wastewater using machine learning according to the present disclosure, the vortex is reduced between the pair of impellers on the impeller inlet side.

Figure 22:
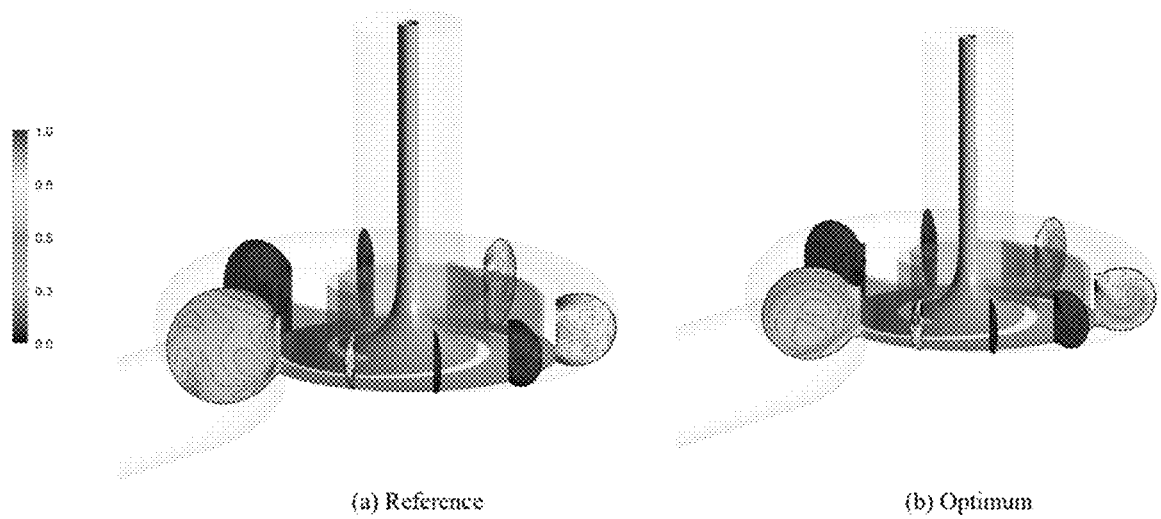
FIG. 22 is a streamline distribution diagram illustrating a flow rate inside a volute in the two-vane pump for wastewater according to the related art and a flow rate inside a volute in the two-vane pump for wastewater designed according to the design method of the two-vane pump for wastewater using machine learning according to one embodiment of the present disclosure.

FIG. 22 is a streamline distribution diagram illustrating a flow rate inside a volute in the two-vane pump for wastewater according to the related art and a flow rate inside a volute in the two-vane pump for wastewater designed according to the design method of the two-vane pump for wastewater using machine learning according to one embodiment of the present disclosure.

Referring to FIG. 22, compared to the two-vane pump for wastewater of the related art, in the two-vane pump 100 for wastewater designed according to the design method of the two-vane pump for wastewater using machine learning according to the present disclosure, the flow rate distribution inside the volute becomes uniform, resulting in less turbulence.

Figure 23:
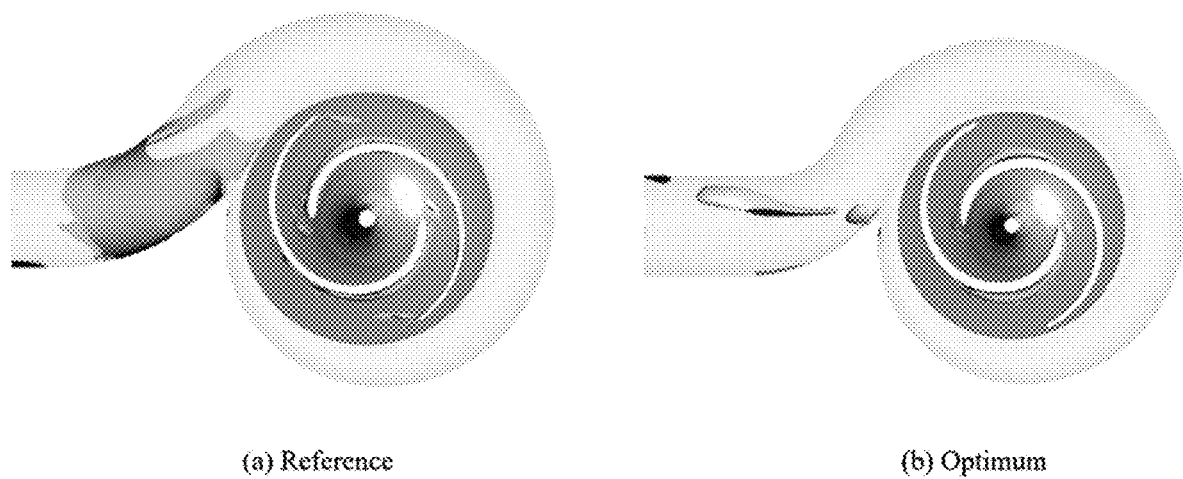
FIG. 23 is a streamline distribution diagram illustrating a low-speed region of 1 m/s or less in the two-vane pump for wastewater according to the related art and a low-speed region of 1 m/s or less in the two-vane pump for wastewater designed according to the design method of the two-vane pump for wastewater using machine learning according to one embodiment of the present disclosure.

FIG. 23 is a streamline distribution diagram illustrating a low-speed region of 1 m/s or less in the two-vane pump for wastewater according to the related art and a low-speed region of 1 m/s or less in the two-vane pump for wastewater designed according to the design method of the two-vane pump for wastewater using machine learning according to one embodiment of the present disclosure.

Compared to the two-vane pump for wastewater of the related art, in the two-vane pump 100 for wastewater designed according to the design method of the two-vane pump for wastewater using machine learning according to the present disclosure, an area where the flow rate decreases is reduced at the volute outlet side, and, thus, the head and efficiency can be improved.

The description of the present disclosure described above is for illustration, and a person of ordinary skill in the technical field to which the present disclosure belongs can easily transform the present disclosure into another specific form without changing the technical idea or essential characteristics of the present disclosure. Therefore, it should be understood that the embodiments described above are illustrative in all respects and not restrictive. For example, each component described as a single type may be implemented in a dispersed form, and likewise, components described as distributed may be implemented in a combined form.

A scope of the present disclosure is indicated by the following claims, and all changes or modifications derived from the meaning and scope of the claims and their equivalent concepts should be construed as being included in the scope of the present disclosure.

According to the present disclosure, it is possible to prevent failure and damage by pumping manure, wastewater, filth, and solids without clogging as designed, and have a high pumping efficiency.

In addition, it is possible to conveniently design a two-vane pump having a desired target specification by using the design derived according to the optimal design method of the present disclosure.

In particular, it is possible to design a two-vane pump with maximum efficiency and sizes of passable solids at the target head.

Effects of the present disclosure are not limited to the above effects, and it should be understood to include all effects that can be inferred from the detailed description of the present disclosure or the configuration of the invention described in claims.

What is claimed is:

1. A design method of two-vane pump for wastewater using machine learning, the design method comprising:
   a) setting an objective function;
   b) setting design variables of an impeller and a volute for deriving the set objective function and a range of each design variable;
   c) deriving a plurality of experimental points including values of the design variables within a range of a design variable;
   d) generating an input value by calculating a value of the objective function through numerical analysis of each of the derived experimental points;
   e) constructing a surrogate model through machine learning for the input value;
   f) Deriving an optimal design of the two-vane pump for wastewater from the constructed surrogate model; and
   g) outputting at least one of a visual representation of the optimal design or a design value associated with the optimal design;
   wherein the design variable includes:
   a first variable which is a y-axis displacement of one end of the impeller located on an inlet side of a wastewater pump;
   a second variable that is a y-axis displacement of another end of the impeller; and
   a third variable that is a cross-sectional area according to a volute angle of the volute;
   wherein in the e), the surrogate model is constituted by a radial basis neural network (RBNN) artificial neural network;
   wherein the e) includes:
   e1) deriving a variable value for constructing the surrogate model through machine learning for the input value; and
   e2) constructing the surrogate model using the derived variable value; and
   wherein the f) includes:
   f1) predicting the objective function value by substituting a randomly selected design variable value in the surrogate model into a genetic algorithm;
   f2) deriving a pareto-optimal front surface based on a correlation between predicted objective function values; and
   f3) deriving an optimal design of the two-vane pump for wastewater that is a design variable value for a target design function value in the derived pareto-optimal front surface.

2. The design method of claim 1, wherein in the a), the objective function is a head, efficiency, and a maximum volume of passable solids.

3. The design method of claim 1, wherein in the c), an experimental point is derived by Latin Hypercube Sampling.

4. The design method of claim 1, wherein in the d), the input value includes a value of the design variable constituting an experimental point and a value of the objective function calculated through numerical analysis for the value of the design variable.

5. The design method of claim 1, wherein the e1) includes:
   i) dividing the input value into K separated subsets;
   ii) selecting test folds that do not overlap with each other from the K separated subsets;
   iii) training the surrogate model by performing machine learning only with a training fold, which is a portion excluding a test fold from each of the subsets;
   iv) deriving a relative error by comparing a predicted value of the surrogate model trained with the training fold with an actual value of the test fold for each of the subsets;
   v) summing relative errors derived from the K subsets to derive a relative error sum; and
   vi) repeatedly performing the dividing to the deriving of the relative error sum so that a variable value at which the relative error sum is a minimum is derived.

6. The design method of claim 1, wherein in the e1), the variable value includes weight, a number of neurons, and a spread constant.

\* \* \* \* \*